United States Patent
Birdsley et al.

(10) Patent No.: US 6,850,081 B1
(45) Date of Patent: Feb. 1, 2005

(54) SEMICONDUCTOR DIE ANALYSIS VIA FIBER OPTIC COMMUNICATION

(75) Inventors: Jeffrey D. Birdsley, Austin, TX (US); Michael R. Bruce, Austin, TX (US); Brennan V. Davis, Austin, TX (US); Rosalinda M. Ring, Austin, TX (US); Daniel L. Stone, Cedar Park, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/164,506

(22) Filed: Jun. 5, 2002

Related U.S. Application Data

(60) Provisional application No. 60/307,871, filed on Jul. 26, 2001.

(51) Int. Cl.[7] .................. G01R 31/303; G01R 31/28
(52) U.S. Cl. ............................. 324/752; 324/763
(58) Field of Search ..................... 324/752, 501, 324/763, 765; 714/733, 734

(56) References Cited

U.S. PATENT DOCUMENTS

| | | | | |
|---|---|---|---|---|
| 3,991,302 A | * | 11/1976 | Danner | 324/501 |
| 4,389,669 A | * | 6/1983 | Epstein et al. | 348/126 |
| 4,680,635 A | * | 7/1987 | Khurana | 348/79 |
| 4,755,874 A | * | 7/1988 | Esrig et al. | 348/126 |
| 5,270,655 A | * | 12/1993 | Tomita | 324/767 |
| 5,570,035 A | * | 10/1996 | Dukes et al. | 324/763 |
| 5,764,655 A | * | 6/1998 | Kirihata et al. | 714/733 |
| 5,937,274 A | | 8/1999 | Kondow et al. | 438/47 |
| 6,058,497 A | * | 5/2000 | Tuttle | 714/733 |
| 6,119,255 A | * | 9/2000 | Akram | 714/724 |
| 6,331,782 B1 | * | 12/2001 | White et al. | 324/763 |

\* cited by examiner

*Primary Examiner*—Ernest Karlsen

(57) ABSTRACT

Semiconductor analysis is improved via the use of fiber optic communications. According to an example embodiment of the present invention, a stimulation device is adapted to stimulate an integrated circuit die, and the die generates a response to the stimulation. An optical signal generator, either incorporated into the die or coupled to the die, detects the response, converts the response to an optical signal and transmits the optical signal. The optical signal is received at a testing arrangement adapted to analyze the die therefrom. The optical signal is used to analyze the die, improving signal quality and the ability to perform high-speed analysis of the die.

7 Claims, 3 Drawing Sheets

SEMICONDUCTOR DIE ANALYSIS VIA FIBER OPTIC COMMUNICATION

This is a conversion of U.S. Provisional Patent Application Ser. No. 60/307,871, filed on Jul. 26, 2001 (AMDA.481P1/TT3982), to which Applicant claims priority under 35 U.S.C. § 119(e).

FIELD OF THE INVENTION

The present invention relates to semiconductor devices and, more particularly, to their testing and analysis thereof using fiber optic communication.

BACKGROUND OF THE INVENTION

Recent technological advances in the semiconductor industry have permitted dramatic increases in circuit density and complexity, and commensurate decreases in power consumption and package sizes for integrated circuit devices. Single-chip microprocessors now include many millions of transistors operating at speeds of hundreds of millions of instructions per second to be packaged in relatively small, air-cooled semiconductor device packages. A byproduct of these technological advances has been an increased demand for semiconductor-based products, as well as increased demand for these products to be fast, reliable, and inexpensive. These and other demands have led to increased pressure to manufacture a large number of semiconductor devices at an efficient pace while increasing the complexity and improving the reliability of the devices.

As the manufacturing processes for semiconductor devices and integrated circuits increase in difficulty, methods for manufacturing, testing and debugging these devices become increasingly important. Not only is it important to ensure that individual chips are functional, it is also important to ensure that batches of chips perform consistently. In addition, the ability to detect a defective manufacturing process early is helpful for reducing the possibility of manufacturing a defective device. It is also helpful to be able to perform the manufacture, testing and debugging of integrated circuits in an efficient and timely manner.

One method of testing integrated circuit dice currently involves the use of coaxial cable or other conductive metal cables to relay information, such as between the device under test (DUT) and the tester or test fixture, and between a testing arrangement and an analysis device or computer. In one common implementation a test head that contains an interface for stimulating and receiving a response to the stimulation from the die draws signals from the die to a computerized tester that both controls the stimulation provided and analyzes the response. As the operating speeds of integrated circuit dice increase, however, conventional methods of analyzing the dice can introduce difficulties including signal delay, signal corruption and other speed and quality-related issues.

SUMMARY OF THE INVENTION

In connection with the present invention, it has been discovered that limits in semiconductor die analysis are largely due to issues surrounding the integrity of the circuit signal under analysis, and that by preserving the integrity of the signal transmitted from the DUT and the tester during analysis of a semiconductor die, these limitations are significantly overcome. The present invention is exemplified in a number of implementations and applications, some of which are summarized below.

According to an example embodiment of the present invention, DUT signals are transmitted optically from the integrated circuit die and the tester used to test the die. A stimulation arrangement, such as a power supply adapted to operate the die under selected test conditions, is adapted to provide stimulation to the die. The stimulation is in the form of conventional electrical signals, or in an alternate embodiment, the signals are optical signals that are received by a photodiode coupled or incorporated into the die. In response to the stimulation, the die generates an output signal. The output signal is converted to light pulses and then transmitted in the form of an optical signal to a photodetector at an analysis device. In one implementation, the light pulses are generated by a photoemitter incorporated onto the die, and in another implementation the pulses are generated external to and communicatively coupled to the die. The photoemitter can be adapted to use an electrical characteristic, such as a voltage from a critical timing path or other circuitry within the die, to generate the optical signal. The optical signal is used to analyze the die, improving signal quality and the ability to perform high-speed analysis of the die.

In another example embodiment of the present invention, a multiplexer is adapted to obtain electrical characteristics from a plurality of circuit regions in the die. The multiplexer includes at least one photodiode adapted to generate a fiber optic signal representing selected ones of the electrical characteristics. In this implementation, the multiplexer receives electrical characterists as an electrical signal, and then converts the electric signal to an optical signal.

In a more particular example embodiment of the present invention, a plurality of these photo-generating devices are used to obtain signals representing an electrical characteristic from selected portions of circuitry in the die. A multiplexer is coupled to each of the photoemitters and adapted to detect and route optical signals obtained by each of the photoemitters. The outputs are multiplexed and an optical carrying arrangement is then used to relay the signal data from the die to a tester for analysis. In this implementation, the multiplexer receives and sends signals in optical form.

The above summary of the present invention is not intended to describe each illustrated embodiment, or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
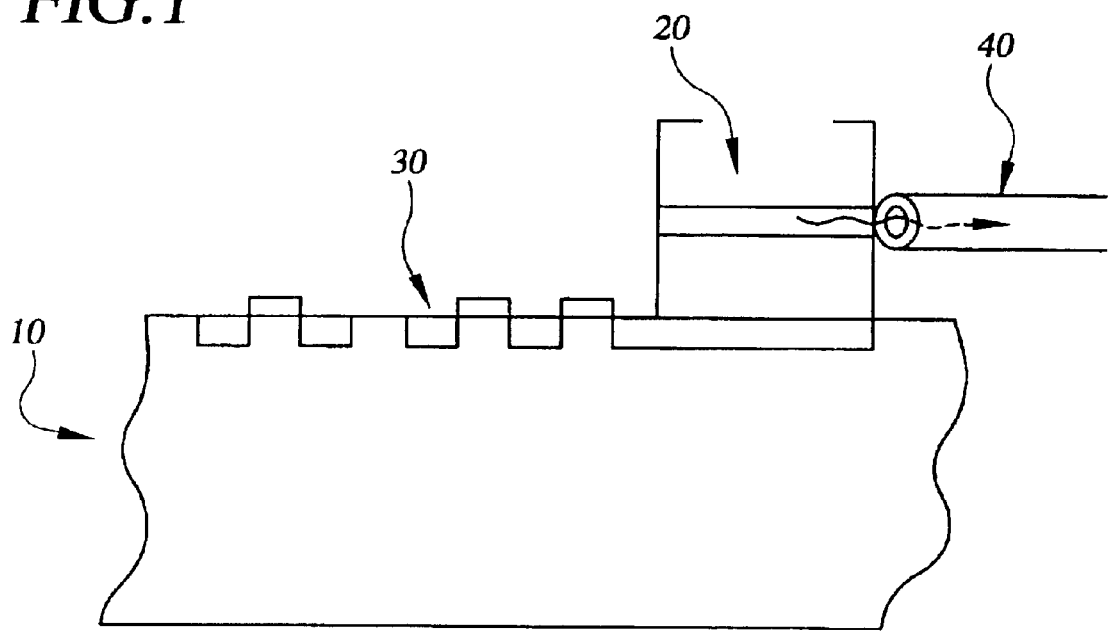
FIG. 1 is an optical signal generator incorporated onto an integrated circuit die, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION OF THE INVENTION

The present invention is believed to be applicable to a variety of different types of semiconductor devices, and is particularly applicable to integrated circuit dice benefiting from or requiring analysis. Various aspects of the invention may be appreciated through a discussion of specific examples using this context without necessarily limiting the invention to the specific examples.

In one example embodiment of the present invention, an optical signal generator, such as a photoemitter, is constructed into an integrated circuit die. The photoemitter includes a laser diode that utilizes an electrical characteristic of the die to generate a corresponding optical signal. Electrical characteristics, such as characteristics of transistors, critical timing pathways and/or other circuitry are converted from electrical signals to optical signals and are transmitted to a tester. A light-generating layer of the laser diode is placed close to a coupling to which a fiber optic cable is connected, and the generated light enters the fiber optic cable and is transmitted to the tester.

In another example embodiment of the present invention, an electronic multiplexer is designed to selectively send electrical output signals generated by an integrated circuit die to a laser diode for conversion to an optical signal and transmission to a tester. The signals selected for testing include those from the critical timing pathways, as known from the design of the die. The multiplexer is located and coupled to the die in a device such as a printed circuit board. The multiplexer receives signals from the integrated circuit and multiplexes the signals, sending copies of the signals from the critical pathways to a laser diode for transmission as an optical signal. This type of multiplexing facilitates testing of a packaged integrated circuit die after incorporation into an electronic device to determine if the die is a cause of a failure in the electronic device. The use of high speed and high fidelity optical signals generated by a laser diode for transmission of test signals allows the testing to be performed at a remote location from the tester.

In a more particular implementation, a plurality of photoemitters are constructed in the die, and the output is coupled to an optical multiplexer. For example, optical multiplexers such as the 1912 AWG available from Alcatel Optronics of Reston, Va., or other multiplexers available from various manufactures, may be useful in connection with the present invention. The multiplexer receives the optical signal inputs from the plurality of laser diodes, multiplexes the signals and sends a multiplexed optical signal to a tester for analysis.

In another example embodiment of the present invention, a photoemitter including a III-V compound semiconductor laser diode is constructed in a silicon substrate into which other circuitry of various types is constructed. The possible types of circuitry in the die encompass a variety including both electrical and optical circuitry (e.g., an opto-electronic device). The electronic portion uses conventional transistors and other circuitry formed into a silicon substrate. The laser diode is also constructed into the silicon substrate and is used to transmit the output from the die.

In another example embodiment of the present invention, a die is stimulated by optical signals transmitted from a tester to a photodetector built into a silicon die and including an avalanche photodiode. The photodiode includes a III-V compound semiconductor that converts electrical signals to optical signals. The avalanche photodiode receives the optical signal and converts it into an electrical signal. The electrical signal drives the chip. In this way, the die is stimulated through the use of optical signals that provide characteristics including improved signal clarity and increased signal speed.

In another example embodiment, the die is coupled to a package that includes a multiplexer and a photoemitter. The die is mounted onto the package by temporary or permanent means, and receives input through the die. An electrical signal from the die is detected by the multiplexer in the package via leads from the contact points on the die. Signals from the die are multiplexed and delivered to a laser diode where they are converted into an optical signal. The optical signal is sent to a tester and is used to analyze the die.

In another example embodiment, an opto-electronic integrated circuit device 10 contains a laser diode 20 integrated into a die also containing electronic circuitry 30 shown in FIG. 1. The laser diode receives an electric signal from the circuitry and generates a corresponding optical signal that is captured and transmitted by a fiber optic cable 40 positioned to capture light generated by the laser diode.

Figure 2:
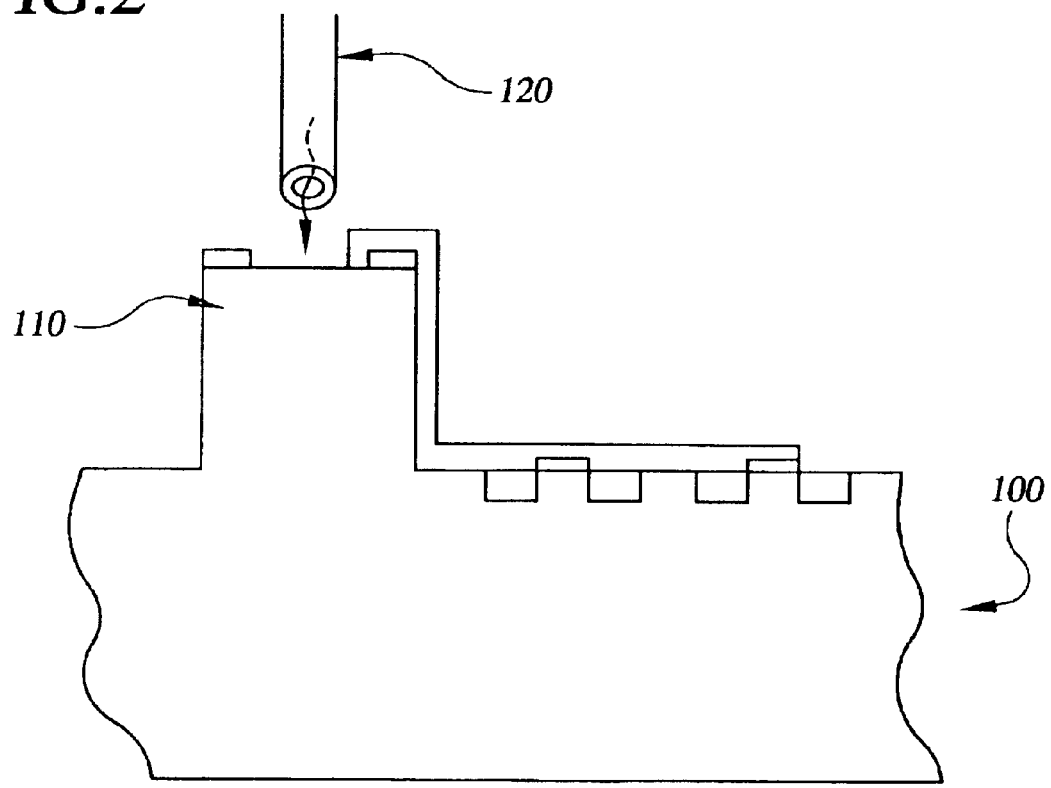
FIG. 2 is an optical signal receiver incorporated into an integrated circuit die, according to another example embodiment of the present invention.

In another example embodiment of the present invention, FIG. 2 shows an opto-electronic integrated circuit device 100 undergoing testing. The device 100 includes a photodiode 110 through which it receives optical inputs via a fiber optic cable 120. The input signal is converted to an electrical signal by the photodiode and used to operate the die 100. Advantages to the optical stimulation of the die are numerous. The speed of the transmission from stimulation device to die and the fidelity of the signal are improved.

Figure 3:
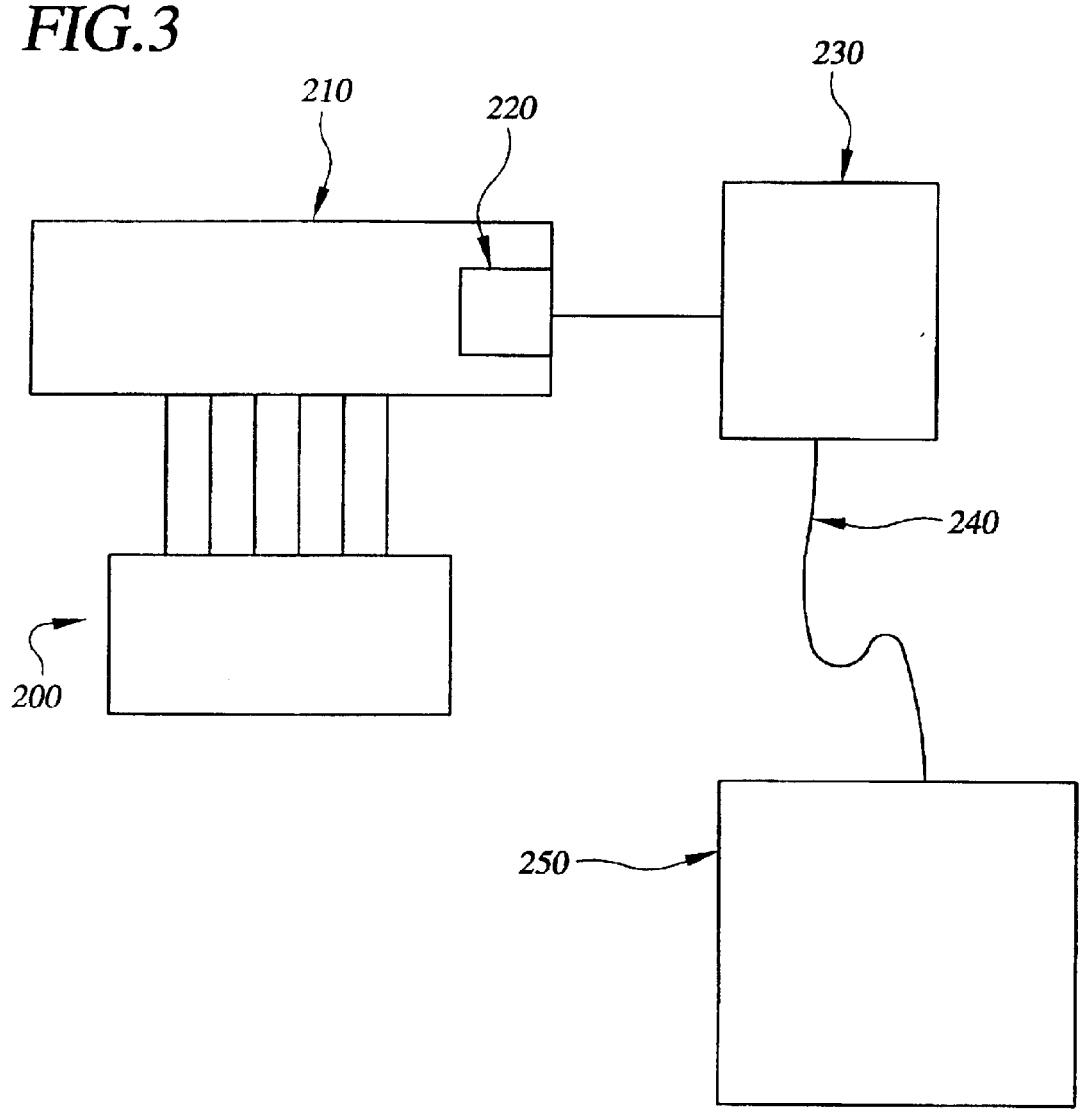
FIG. 3 is an integrated circuit die undergoing analysis, according to another example embodiment of the present invention.

In another example embodiment of the present invention, an integrated circuit die 200 is contacted by a package 210 to monitor the critical timing pathways of the die as shown in FIG. 3. The package draws off a plurality of signals from the die, which an integrated multiplexer 220 is adapted to multiplex. The signals drawn off the die include electrical signals from selected portions of circuitry in the die. The multiplexer retransmits the plurality of signals using a single signal, which is sent to a laser diode 230. The laser diode converts the electrical signal to an optical signal, which is sent to a tester 250 via a fiber optic cable 240, where it is used for analyzing the die.

Figure 4:
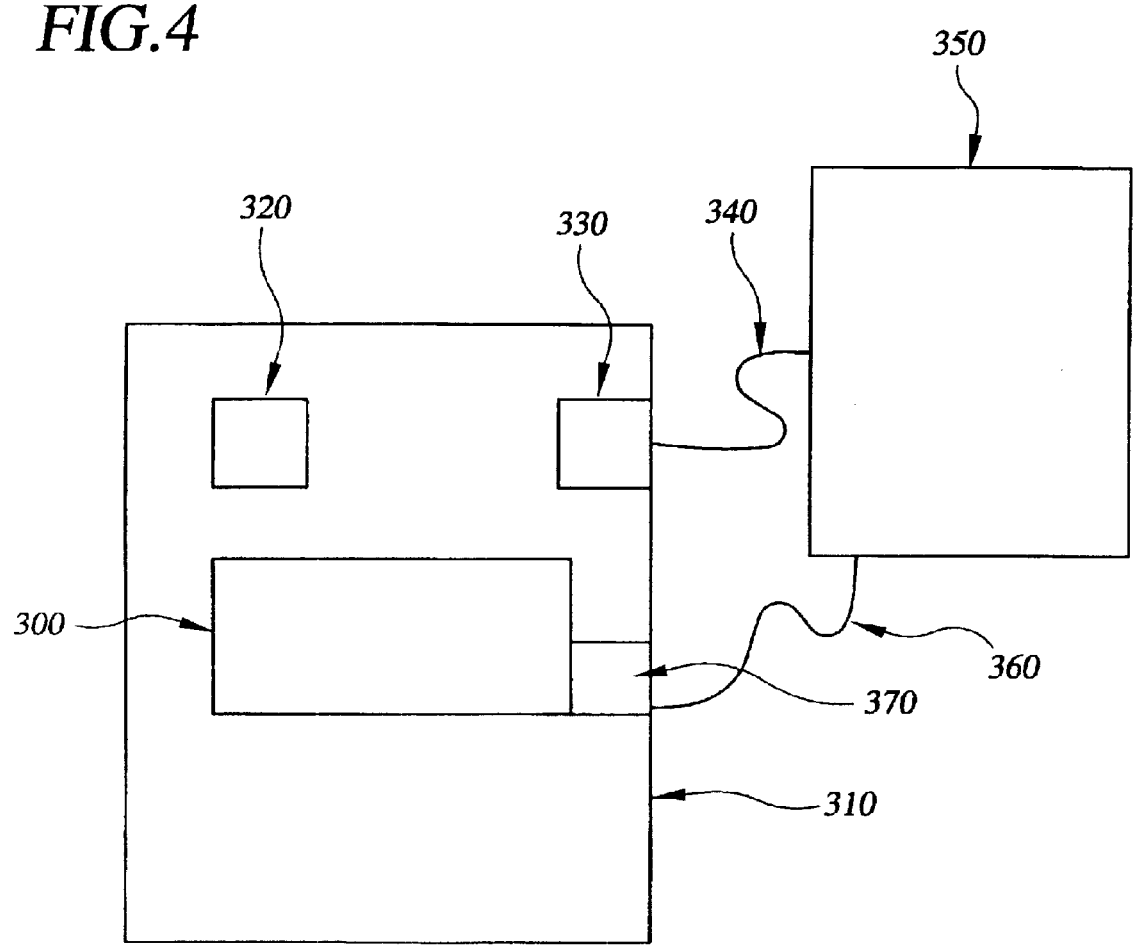
FIG. 4 is an integrated circuit die undergoing analysis, according to another example embodiment of the present invention.

In another example embodiment of the present invention, FIG. 4 shows an integrated circuit die 300 mounted on a package 310 that includes both a multiplexer 320 fill and a laser diode 330. The packaged die is coupled via a fiber optic cable 340 to a tester 350. Control inputs, including test patterns and include known failure conditions of the die, are provided to the package. The output from the die is sent to the multiplexer 320 where it is multiplexed and sent to the laser diode 330. The laser diode converts the signal into an optical signal that is transmitted via an optical signal carrier 340 to a tester 350. The tester 350 is communicatively coupled to the package 310, and is adapted to drive the chip through test patterns by sending chip driving data to the package 310 using optical signals transmitted via an optical signal carrier 360. The optical signal carriers here are displayed as two distinct connections. However, in various implementations both the input and output signals are transmitted over the same carrier. The package 310 contains a photoreceptor 370 which is adapted to receive the optical signal from the tester 350, convert the optical signal to an electrical signal, and deliver the electrical signal to the integrated circuit die being tested.

While the present invention has been described with reference to several particular example embodiments, those skilled in the art will recognize that many changes may be made thereto without departing from the spirit and scope of the present invention, which is set forth in the following claims.

What is claimed is:

1. A system for analyzing circuitry in a semiconductor die, the system comprising:
    a stimulation arrangement adapted to stimulate circuitry in the die;
    an optical signal generator adapted to generate optical signals in response to the stimulated circuitry and including a plurality of laser diodes and a multiplexer, wherein at least one of the laser diodes is adapted to convert a detected electrical characteristic into one of the optical signals; and
    an analysis device adapted to receive the optical signals and analyze the circuitry therefrom.

2. The system of claim 1, wherein the laser diodes and the multiplexer are formed at a package and coupled to the die.

3. The system of claim 1, wherein a multiplexer is adapted to receive a plurality of outputs from critical timing paths within a die and coordinate the outputs for transmission.

4. The system of claim 1, wherein the multiplexer device is adapted to selectively transmit the output of critical circuit paths in the die.

5. The system of claim 1, wherein the multiplexer device can be selectively engaged or disengaged.

6. The system of claim 1, wherein the multiplexer is adapted to detect electrical signals from the die and transmit the electrical signals to selected ones of the diodes, and wherein each of the diodes is adapted to convert the electrical signal to an optical signal.

7. The system of claim 1, wherein the diodes are adapted to detect electrical signals from the die and convert the signals to optical signals, and wherein the multiplexer is adapted to receive the converted optical signals and transmit selected ones of the optical signals.

* * * * *